United States Patent
Kim

(10) Patent No.: US 7,929,107 B2
(45) Date of Patent: Apr. 19, 2011

(54) EXPOSURE CHUCK COMPRISING A SURFACE OF A LIFT BAR HAVING A CONCAVO-CONVEX STRUCTURE

(75) Inventor: Yong Hun Kim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 523 days.

(21) Appl. No.: 11/167,603

(22) Filed: Jun. 28, 2005

(65) Prior Publication Data

US 2006/0017005 A1    Jan. 26, 2006

(30) Foreign Application Priority Data

Jun. 30, 2004 (KR) .................. 10-2004-0050813

(51) Int. Cl.
  *G02F 1/13* (2006.01)
  *G02F 1/1333* (2006.01)
(52) U.S. Cl. ........................ 349/187; 349/158

(58) Field of Classification Search .................... 349/43, 349/158, 187
See application file for complete search history.

(56) References Cited

U.S. PATENT DOCUMENTS

| | | | |
|---|---|---|---|
| 7,092,231 B2 * | 8/2006 | Hoeks et al. .................. 361/234 |
| 7,230,669 B1 * | 6/2007 | Tashiro et al. ................ 349/153 |
| 2003/0171057 A1 * | 9/2003 | Lee et al. ........................ 445/24 |
| 2004/0001177 A1 * | 1/2004 | Byun et al. .................... 349/187 |

\* cited by examiner

*Primary Examiner* — Brian M. Healy
*Assistant Examiner* — Charles Chang
(74) *Attorney, Agent, or Firm* — Morgan, Lewis & Bockius LLP

(57) ABSTRACT

An exposure chuck includes a lift bar to transfer a substrate; a lift bar mounting unit including the lift bar to move the substrate; and a substrate loading unit to load the substrate as the lift bar in the lift bar mounting unit transfers the substrate such that the substrate is separated from the lift bar, wherein a surface of the lift bar contacting the substrate has a concavo-convex structure.

2 Claims, 6 Drawing Sheets

EXPOSURE CHUCK COMPRISING A SURFACE OF A LIFT BAR HAVING A CONCAVO-CONVEX STRUCTURE

This application claims the benefit of the Korean Patent Application No. 50813/2004 filed in Korea on Jun. 30, 2004, which is hereby incorporated by reference.

BACKGROUND OF THE INVENTION

1. Field of the Invention

The present invention relates to an exposure chuck and a method for fabricating a liquid crystal display (LCD) device using the same, and more particularly, to an exposure chuck capable of preventing the generation of stains in an exposing process while fabricating an in-plane switching mode LCD.

2. Discussion of the Related Art

Flat panel display devices having useful advantages, such as providing a high quality picture and operation at low power consumption rate, are becoming commercially used display devices. One type of the flat panel display devices includes liquid crystal display (LCD) devices generally including a thin film transistor (TFT) array substrate and a color filter substrate facing each other. The two substrates are positioned at some distance from each other and a liquid crystal layer is formed in the interval of the two substrates.

On the TFT array substrate, pixels are arranged in a matrix configuration identifying unit pixels, and a TFT, a pixel electrode, and a capacitor are formed in each of the unit pixels. On the color filter substrate, a common electrode for applying an electric field to the liquid crystal layer, an RGB color filter for implementing actual colors, and a black matrix are formed. An alignment layer is formed on the surface of the TFT facing the color filter substrate and a rubbing operation is performed, thereby arranging the liquid crystal layer in a same direction as the rubbing direction. When the electric field is applied between the pixel electrode formed in each of the unit pixels on the TFT array substrate and the common electrode formed at the front surface of the color filter substrate, the liquid crystal layer passes light or shields light by a dielectric anisotropy that rotates molecules of the liquid crystal layer, to display characters or images. However, the twisted nematic mode LCD device has a disadvantage such that a viewing angle is narrow. Accordingly, an in-plane switching mode LCD is actively researched to increase the viewing angle by arranging the liquid crystal molecules to be parallel with a substrate.

FIGS. 1A and 1B illustrate a unit pixel of an in-plane switching LCD according to the related art. FIG. 1A is a plane view of the in-plane switching LCD, and FIG. 1B is a cross sectional view along I-I' of FIG. 1A. As shown, a gate line 1 and a data line 3 are horizontally and vertically arranged on a transparent first substrate 10 to define a pixel region. For the convenience of discussion, only one pixel is illustrated in FIGS. 1A and 1B. The in-plane switching LCD device may include n number of gate lines and m number of data lines, thereby defining an n x m matrix of pixels. At an intersection of the gate line 1 and data line 3, a thin film transistor 9 composed of a gate electrode 1a, a semiconductor layer 5, and source/drain electrodes 2a and 2b is formed. The gate electrode 1a and the source/drain electrodes 2a and 2b are respectively connected to the gate line 1 and the data line 3. In addition, a gate insulating layer 8 is formed on the entire substrate 10.

In the pixel region, a common line 4 is arranged in parallel with the gate line 1, and a pair of electrodes, a common electrode 6 and a pixel electrode 7, are arranged in parallel with the data line 3. The common electrode 6 and the pixel electrode 7 switch an orientation direction of liquid crystal molecules of the liquid crystal layer 13 when horizontal electric field is formed between the common and pixel electrodes. The common electrode 6 is simultaneously formed with the gate line 1 and is connected to the common line 4, and the pixel electrode 7 is simultaneously formed with the source/drain electrodes 2a and 2b and is connected to the drain electrode 2b of the thin film transistor 9. A passivation layer 11 is formed on the entire substrate 10 including the source/drain electrodes 2a and 2b. A pixel electrode line 14, which overlaps the common line 4 and is connected to the pixel electrode 7, forms a storage capacitor Cst such that the insulating layer 8 is positioned between the common line 4 and the pixel electrode line 14.

On a second substrate 20, a black matrix 21 is formed to prevent light from leaking to the TFT 9, the gate line 1, and the data line 3, and a color filter 23. In addition, an overcoat layer 25 for planarizing the color filter 23 is formed on the color filter 23. Alignment layers 12a and 12b for determining an initial alignment direction of liquid crystal molecules are formed on the surfaces of the first substrate 10 and the second substrate 20, respectively. A liquid crystal layer 13 is formed between the first substrate 10 and the second substrate 20, thereby controlling transmittance of light by voltages applied to the common electrode 6 and the pixel electrode 7. In the in-plane switching LCD device, the common electrode 6 and the pixel electrode 7 are arranged on the same substrate and generate a horizontal electric field, thereby increasing a viewing angle of the LCD devices. However, since the common electrode 6 and the pixel electrode 7 are made of an opaque metal arranged in the pixel region which lower an aperture ratio, brightness of the LCD devices is degraded. Accordingly, a research to increase the aperture ratio is actively conducted by forming either the common electrode 6 or the pixel electrode 7 from indium tin oxide (ITO) or indium zinc oxide (IZO).

The in-plane switching LCD device of FIGS. 1A and 1B is fabricated by multiple photo-lithography processes including a process for depositing a photoresist, an exposing process, a development process, and an etching process. The exposing process is performed on the substrate using a mask to selectively shield a portion of substrate from light irradiated by an exposing device. First, a layer is formed on the substrate where a pattern is formed. Next, a photoresist is deposited on the layer, and the substrate is loaded onto the exposing device, wherein the substrate and the mask are aligned and light is irradiated on the photoresist through an opening of the mask. At this time, the substrate is placed on a chuck and fixed so that any misalignment between the substrate and the mask may be prevented. During the exposing process, an electrostatic filed is generated due to friction between the substrate and the chuck, wherein foreign materials may be attached onto the substrate. In order to minimize the foreign materials, a groove is formed on a surface of the chuck to reduce a frictional area between the chuck and the substrate, thereby reducing the electrostatic field between the chuck and the substrate.

FIG. 2 illustrates a cross sectional view of the chuck surface according to the related art. As shown in FIG. 2, a chuck 51 used during an exposing process is provided with a substrate loading unit 53 for loading a substrate 50 and a lift bar mounting unit 55. A lift bar 57 is mounted in the lift bar mounting unit 55 before the substrate 50 is loaded on the substrate loading unit 53, and is used to prevent bending of the substrate 50. When using the lift bar 57, the chuck 51 has to be provided with the lift bar mounting unit 55. The substrate 50 transferred by the lift bar 57 is loaded to the substrate loading unit 53 as the lift bar 57 moves in the lift bar mounting unit 55.

The substrate 50 loaded on the chuck 51 is exposed to light irradiated from the upper side. If the layer on the substrate 50, which will be etched, is formed of a transparent material (for example, an ITO layer for forming pixel and common electrodes), light passes through the substrate 50 and is reflected by the chuck 51. Since the light passes through the substrate 50 again, the light passes through the photoresist twice.

When the pixel electrode or the common electrode of the in-plane switching LCD device is formed of a transparent electrode, a width of the electrode determines the aperture ratio. While forming the pixel electrode and the common electrode in the exposing process, if the pixel and common electrodes have different exposure degrees from an instant region to another region on the substrate due to reflected light by the chuck, the width of the pixel and common electrodes become different in accordance with an intensity of the reflected light. Eventually, the width of the pixel and common electrodes is varied along the surface of the lift bar having non-uniform reflected light, thereby causing stains on a display.

SUMMARY OF THE INVENTION

Accordingly, an object of the present invention is directed to an exposure chuck and method for fabricating liquid crystal display device using the same that substantially obviates one or more of the problems due to limitations and disadvantages of the related art.

An object of the present invention is to provide an exposure chuck minimizing generation of stains due to a reflected light by forming a concavo-convex structure on a surface of a lift bar, and a method for fabricating a liquid crystal display (LCD) device using the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, the exposure chuck and method for fabricating liquid crystal display device using the same includes an exposure chuck having a lift bar to transfer a substrate, a lift bar mounting unit including the lift bar to move the substrate, and a substrate loading unit to load the substrate as the lift bar in the lift bar mounting unit transfers the substrate such that the substrate is separated from the lift bar, wherein a surface of the lift bar contacting the substrate has a concavo-convex structure.

In another aspect, a method for fabricating a liquid crystal display device includes providing a first substrate and a second substrate, forming a data line and gate line on the first substrate, forming a thin film transistor at an intersection of the gate line and data line, a pixel region defined by the intersections of the gate line and data line, forming a first electrode and a second electrode to generate a horizontal electric field in the pixel region, forming a color filter on the second substrate, and forming a liquid crystal layer between the first substrate and the second substrate, wherein the forming either the first electrode or the second electrode further includes forming a transparent conductive film on the first substrate; depositing a photoresist on the transparent conductive film, loading the first substrate having the photoresist deposited thereon to a lift bar having a concavo-convex structure at a surface facing the substrate, loading the substrate onto the chuck using the lift bar mounted in the lift bar mounting unit, exposing the first substrate loaded on the chuck to light and develop to form a photoresist pattern, and etching the transparent conductive film using the photoresist pattern as a mask.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Hereinafter, an exposure chuck and a method for fabricating an in-plane switching liquid crystal display (LCD) device using the same will be explained in more detail with reference to the attached drawings.

Figure 1A:
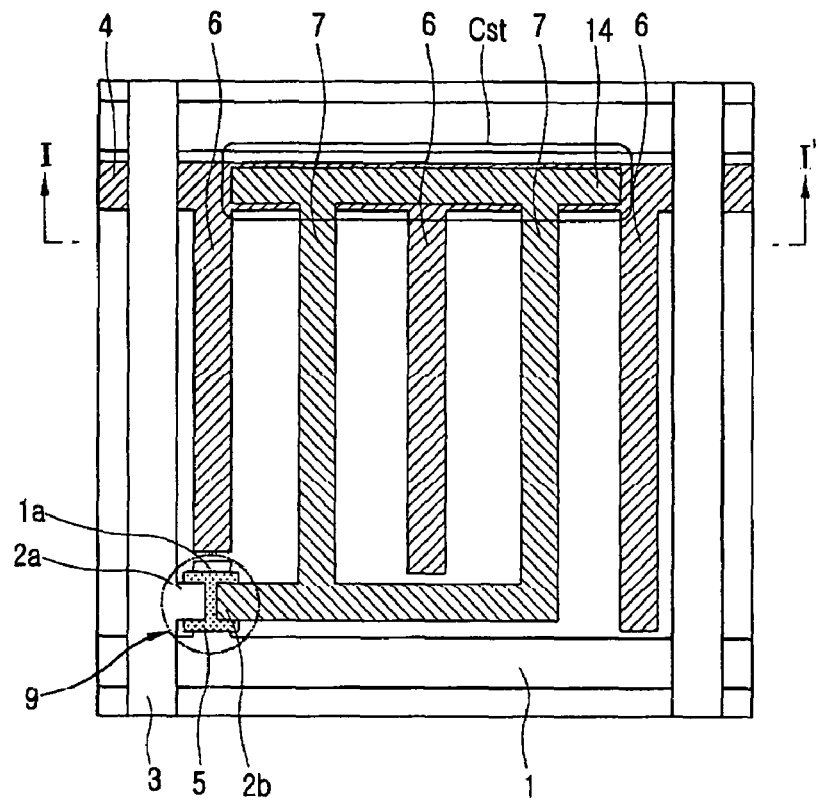
FIG. 1A illustrates a plane view of an related art in-plane switching LCD device according to the related art.
Figure 1B:
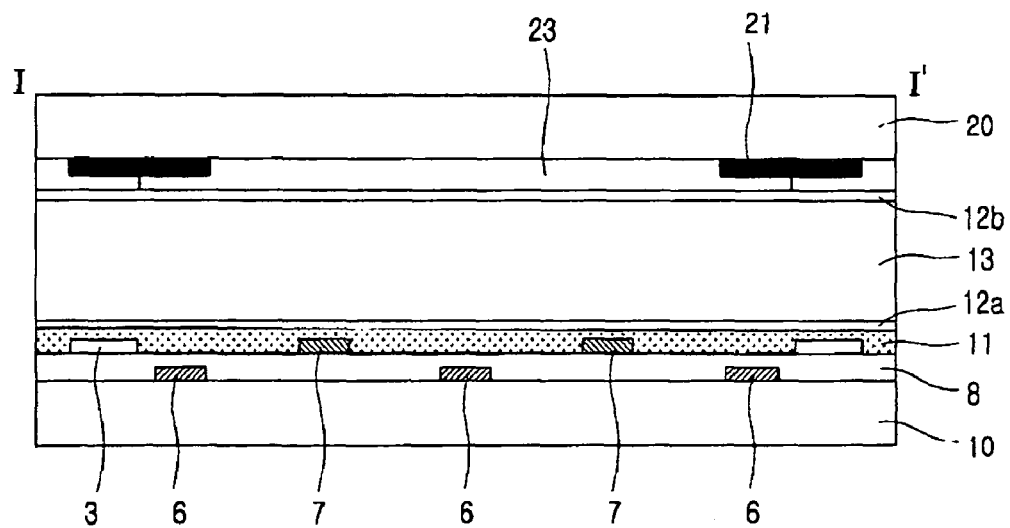
FIG. 1B illustrates a cross sectional view along I-I' of FIG. 1A according to the related art.
Figure 2:
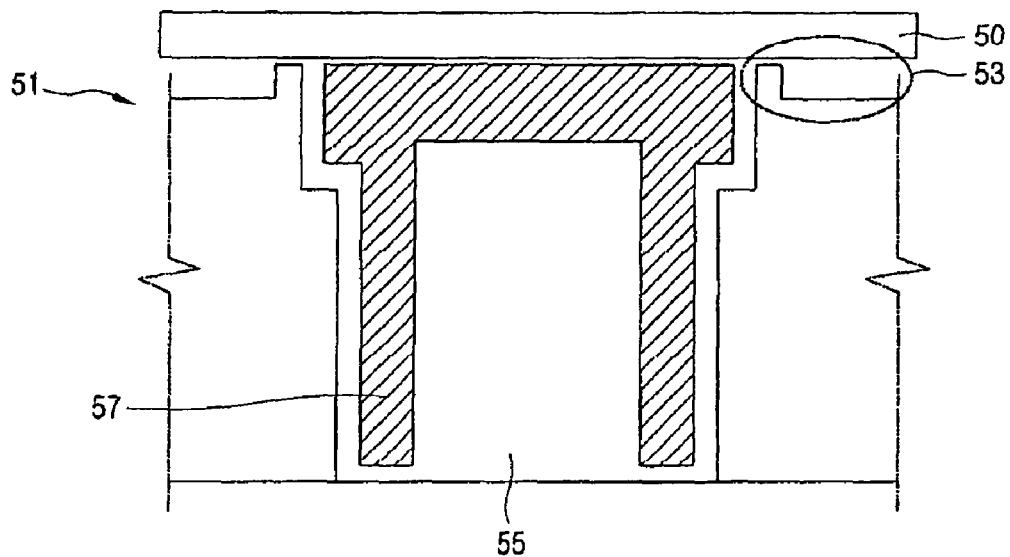
FIG. 2 illustrates a cross sectional view of a lift bar mounting unit according to the related art.
Figure 3:
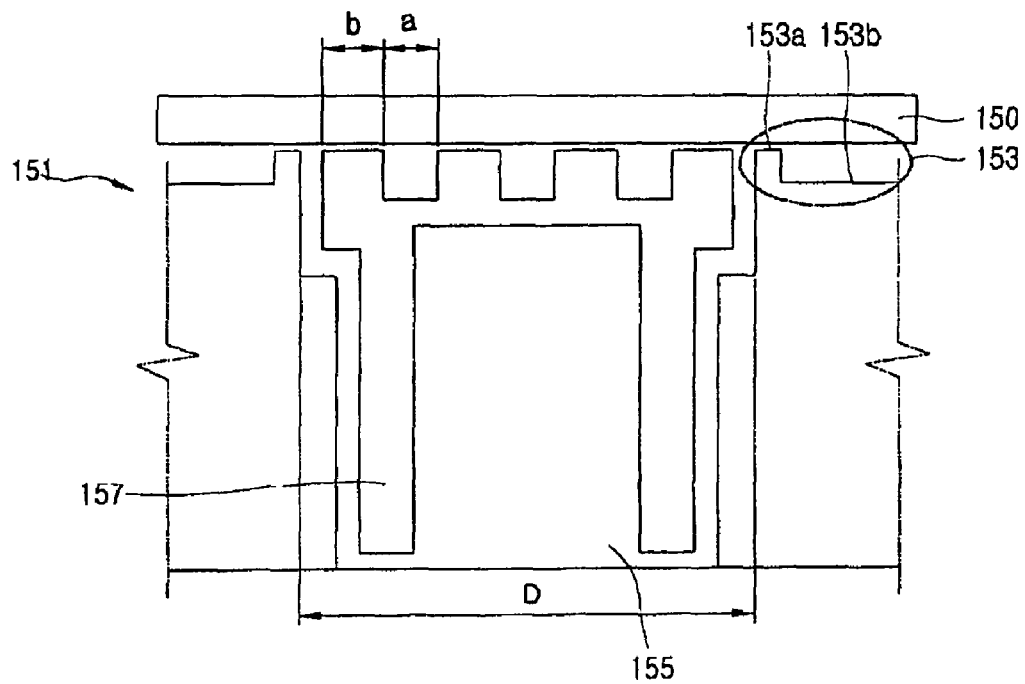
FIG. 3 illustrates a cross sectional view of an exposure chuck according to an exemplary embodiment of the present invention.

FIG. 3 illustrates a cross sectional view of an exposure chuck according to an exemplary embodiment of the present invention. As shown in FIG. 3, an exposure chuck 151 includes a substrate loading unit 153 for loading a substrate 150 during the exposing process and a lift bar mounting unit 155 for mounting a lift bar 157. The substrate loading unit 153 is composed of a contact portion 153a directly contacting the substrate 150 and a non-contact portion 153b. The non-contact portion 153b is a region where a groove of a uniform depth is formed at a surface of the chuck 151 to minimize the surface area of the chuck 151 contacting the substrate 150. The lift bar 157 mounted in the lift bar mounting unit 155 transfers the substrate 150 loaded on the chuck 151. As the substrate 150 becomes larger, the lift bar 157 serves as a supporter for preventing the substrate 150 from being bent.

The lift bar 157 may have a straight shape or a lattice shape when viewed from above, and has a concavo-convex structure (a) and (b) at the surface side which contacts the substrate 150. The concave portion (a) is formed to be equal to or wider than the convex portion (b). A width of the convex portion (b) is formed to be 1 mm or less, and the width of the concave portion (a) is formed at maximum of five times as that of the width of the convex portion (b). The lift bar mounting unit 155 provides a space for mounting the lift bar 157 and has a groove of the same shape as that of the lift bar 157 when viewed from above. In other words, when the lift bar 157 has a straight shape, the lift bar mounting unit 155 also has the same straight shape. Likewise, when the lift bar 157 has a lattice shape, the lift bar mounting unit 155 also has the same lattice shape.

When the substrate 150 loaded on the lift bar 157 is transferred onto the exposure chuck 151, the lift bar 157 is separated from the substrate 150, and the substrate 150 is positioned on the substrate loading unit 153. Next, a layer is disposed on the substrate 150, and the layer is etched to form a photoresist. The photoresist on the substrate 150 is exposed to light using a mask and developed to form a photoresist pattern. Then, using the photoresist pattern as a mask, a layer previously formed on the substrate 150 is etched to form a desired pattern (i.e., a pixel electrode or a common electrode).

During the formation of a pattern on the substrate 150, if the pattern is a transparent electrode, such as the common electrode or the pixel electrode of an in-plane switching LCD device, essentially the photoresist is exposed to light twice. First, by light incident on the photoresist, and second, by light reflected from the surface of a lift bar. This is due to a region of the lift bar 157 supporting the corresponding region D of the substrate 150 reflects light easily. Specifically, an optical reflection rate at the region of the lift bar 157 corresponding to the region D of the substrate 150 has relatively higher rate. According to the present invention, the lift bar 157 is provided with a concavo-convex structure in the regions where light reflection occurs. Since, light reflected from the surface of the lift bar 157 scatters, a gradient of light reflected from the surface of the lift bar 157 is gradual. In addition, varying rate of irradiated light with respect to each region on the substrate decreases such that the rate of change in the aperture ratio is reduced. Accordingly, a stain occurrence on the substrate due to the change in the aperture ratio can be prevented.

Figure 4:
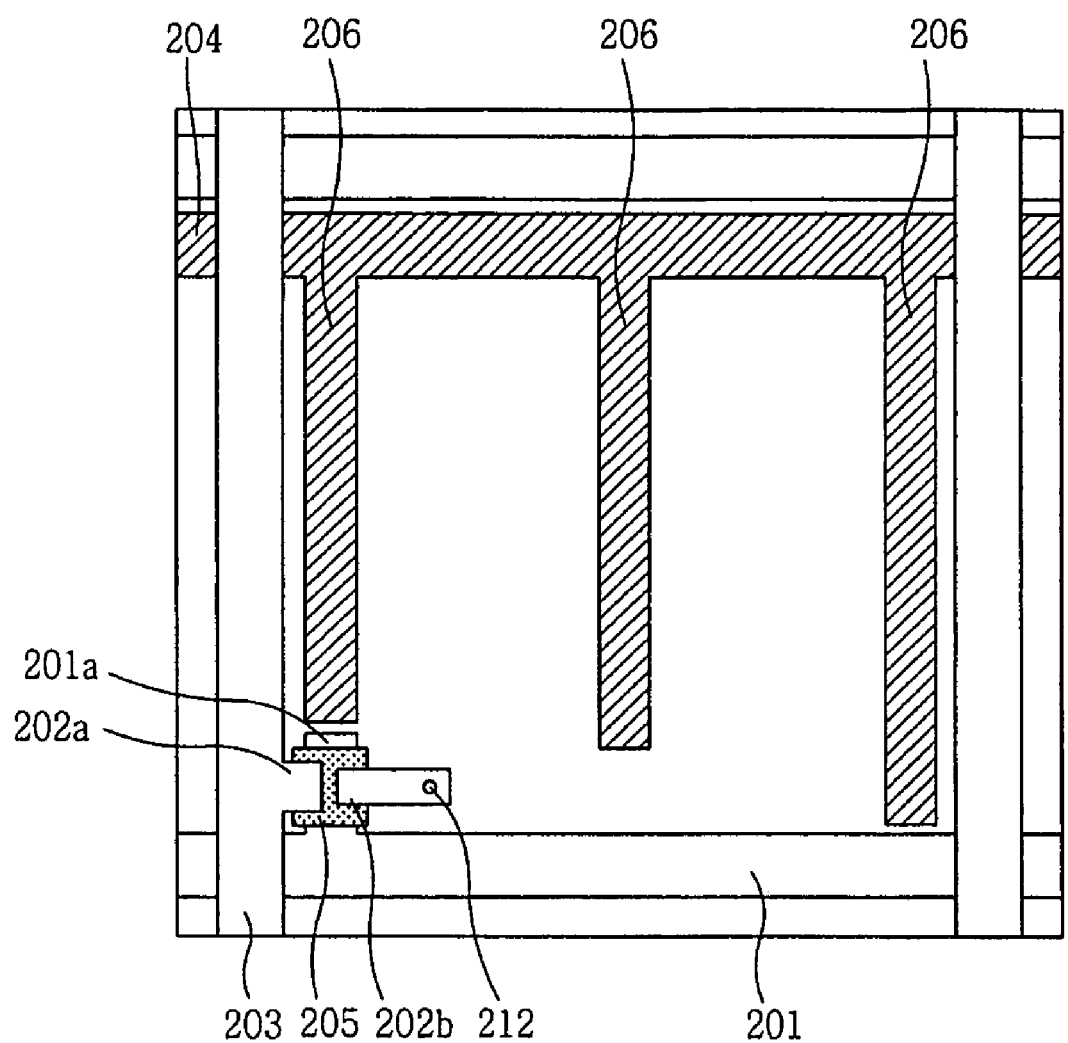
FIG. 4 illustrates a plane view of an in-plane switching LCD device according to an exemplary embodiment of the present invention.

FIG. 4 illustrates a plane view of an in-plane switching LCD device according to an exemplary embodiment of the present invention. As shown in FIG. 4, a transparent first substrate is prepared, and a metal layer, such as Al, Mo, Ta, or Al alloy, or other suitable material, is deposited on the first substrate. Next, the metal layer is patterned to form a gate line 201 arranged along a horizontal direction, a gate electrode 201a extending from the gate line 201, a common electrode 206, and a common line 204 electrically connected to the common electrode 206. Then SiOx or SiNx is deposited on the entire surface of the substrate where the gate electrode 201a and the common electrode 206 are formed, thereby forming a gate insulating layer (not shown). An amorphous silicon and an n+ amorphous silicon are deposited on the gate insulating layer and patterned to form a semiconductor layer 205.

A data line 203 arranged along a vertical direction and the gate line 201 define a pixel region P. Then, a source electrode 202a and a drain electrode 202b extending from the data line 203, which partially overlap with the semiconductor layer 205, are formed. Next, an inorganic material, such as SiOx or SiNx or an organic material such as BCB or acryl, is deposited on the entire substrate to form a passivation layer (not shown). Then, a contact hole 212 for partially exposing the drain electrode 202b is formed. Subsequently, a transparent conductive film, such as an ITO or an IZO, is deposited on the passivation layer by a sputtering method, and a photoresist (not shown) is uniformly deposited on the transparent conductive film.

Figure 5A:
FIG. 5A illustrates a plane view of an exemplary lift bar according to the present invention.
Figure 5B:
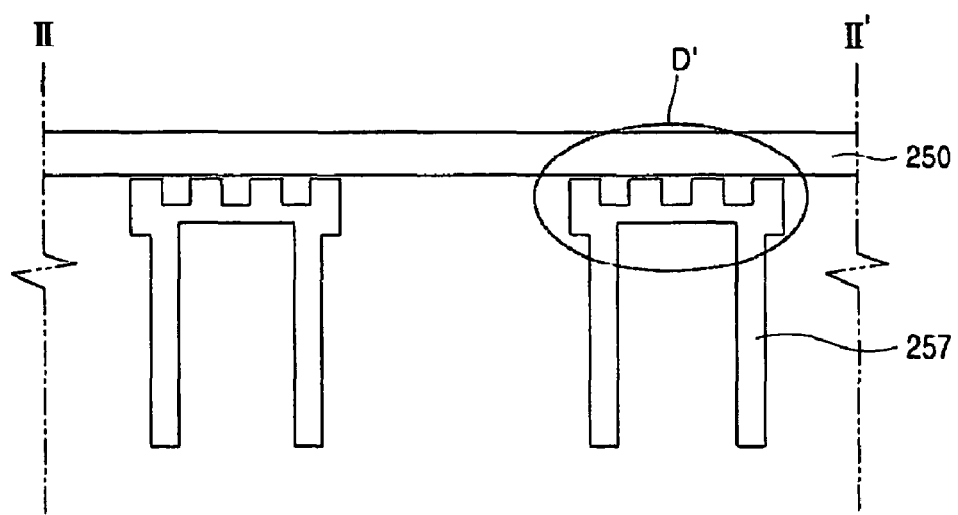
FIG. 5B illustrates a cross sectional view along II-II' of FIG. 5A according to the present invention.

FIG. 5A illustrates a plane view of an exemplary lift bar according to the present invention, and FIG. 5B illustrates a cross sectional view along II-II' of FIG. 5A according to the present invention. As shown in FIG. 5A, a substrate 250, which includes a photoresist, is loaded on a lift bar 257 to transfer the substrate 250 to an exposing device. The lift bar 257 is used to prevent the substrate 250 from being bent and has a straight-line parallel structure when viewed from above. As shown in FIG. 5B, a contact surface D' of the lift bar 257 has a concavo-convex structure.

Figure 6:
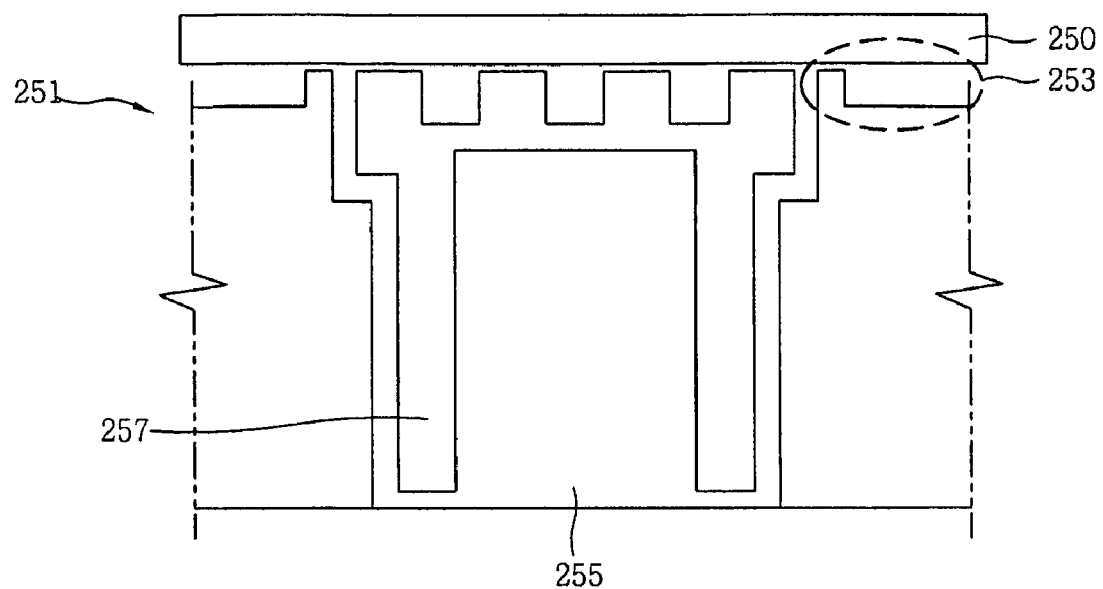
FIG. 6 illustrates an exposing process for forming a pixel electrode in accordance with an exemplary embodiment of the present invention.
Figure 7:
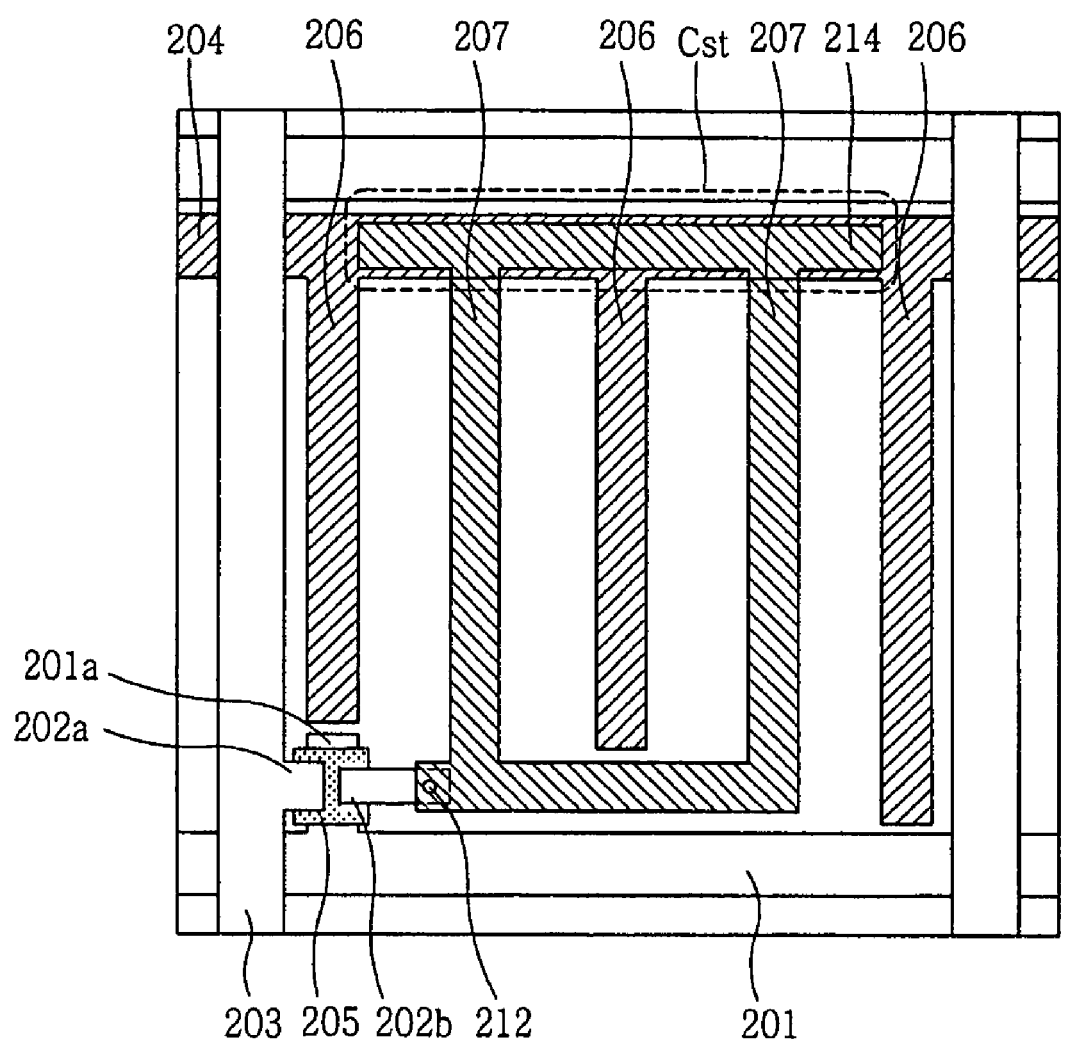
FIG. 7 illustrates a plane view of the in-plane switching LCD device of an exemplary embodiment of the present invention.

FIG. 6 illustrates an exposing process for forming a pixel electrode in accordance with an exemplary embodiment of the present invention. As shown in FIG. 6, the lift bar 257 is mounted in the lift bar mounting unit 255. The exposure chuck 251 houses the lift bar mounting unit 255, and the substrate 250 loaded on the lift bar 257 is re-loaded onto a substrate loading unit 253 of the exposure chuck 251. The first substrate 250 is exposed to light using a mask, and developed to form a pixel electrode 207. The pixel electrode 207 generates a horizontal electric field with the common electrode in the pixel region P. In addition, the pixel electrode 207 forms a pixel electrode line 214, which is electrically connected to the pixel electrode 207. Moreover, the pixel electrode 207 forms a storage capacitor Cst at a portion where the pixel electrode 207 overlaps the common line 206. The pixel electrode 207 is electrically contacting the drain electrode 202b through the contact hole 212. Subsequently, a second substrate (not shown) including a color filter is provided. Then, a liquid crystal layer is formed between the first substrate and the second substrate, thereby fabricating an LCD device. And, FIG. 7 illustrates a plane view of the in-plane switching LCD device of an exemplary embodiment of the present invention.

As described above, the exposure chuck according to the exemplary embodiment of the present invention can prevent the generation of stain due to the reflected light. The exposure chuck of the present invention includes the lift bar mounting unit, having a concavo-convex structure at the surface facing the substrate. Accordingly, the light reflected from the concave-convex surface of the lift bar is scattered and the reflected light has a gradual gradient, thereby preventing the generation of stain.

It will be apparent to those skilled in the art that various modifications and variations can be made in the exposure chuck and method for fabricating liquid crystal display device using the same of the present invention without departing from the spirit or scope of the invention. Thus, it is intended that the present invention cover the modifications and variations of this invention provided they come within the scope of the appended claims and their equivalents.

What is claimed is:

1. An exposure chuck, comprising:
   a plurality of lift bars to transfer a transparent substrate having a transparent conductive film;
   a lift bar mounting unit including the lift bars to move the substrate; and
   a substrate loading unit to load the substrate as the lift bars in the lift bar mounting unit transfers the substrate such that the substrate is separated from the lift bars, wherein a surface of the lift bars contacting the substrate has a concavo-convex structure to scatter light incident on the surface so that the incident light may have a gradual gradient during an exposing process on the transparent conductive film of the substrate, and a convex portion of the concavo-convex structure has a width of 1mm or less, and a width of a concavo portion of the concavo-convex structure ranges from 1mm to 5mm, wherein a plurality of lift bars are arranged in a straight shape when viewed from above, wherein the lift bar mounting unit has a plurality of grooves for receiving the lift bars therein, and the grooves have same shape as that of the lift bar when viewed from above, wherein the substrate loading unit comprises a contact portion contacting the substrate and a non-contact portion having a groove of a uniform depth, the substrate being contacted with the contact portion of the substrate loading unit and not contacted with the surface of the lift bars when the lift bars are completely received in the grooves of the lift bar mounting unit.

2. An exposure chuck, comprising:

a plurality of lift bars to transfer a transparent substrate having a transparent conductive film;

a lift bar mounting unit including the lift bars to move the substrate; and a substrate loading unit to load the substrate as the lift bars in the lift bar mounting unit transfers the substrate such that the substrate is separated from the lift bars, wherein a surface of the lift bars contacting the substrate has a concavo-convex structure to scatter light incident on the surface so that the incident light may have a gradual gradient during an exposing process on the transparent conductive film of the substrate, and a convex portion of the concavo-convex structure has a width of 1mm or less, and a width of a concavo portion of the concavo-convex structure ranges from 1mm to 5mm, wherein a plurality of lift bars are arranged in a lattice shape when viewed from above, wherein the lift bar mounting unit has a plurality of grooves for receiving the lift bars therein, and the grooves have same shape as that of the lift bar when viewed from above, wherein the substrate loading unit comprises a contact portion contacting the substrate and a non-contact portion having a groove of a uniform depth, the substrate being contacted with the contact portion of the substrate loading unit and not contacted with the surface of the lift bars when the lift bars are completely received in the grooves of the lift bar mounting unit.

* * * * *